(12) United States Patent
Du et al.

(10) Patent No.: US 10,208,188 B2
(45) Date of Patent: Feb. 19, 2019

(54) THERMOSETTING RESIN COMPOSITION AND USES THEREOF

(71) Applicant: SHENGYI TECHNOLOGY CO., LTD., Dongguan (CN)

(72) Inventors: Cuiming Du, Dongguan (CN); Liangpeng Hao, Dongguan (CN); Songgang Chai, Dongguan (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 309 days.

(21) Appl. No.: 15/028,578

(22) PCT Filed: Oct. 11, 2013

(86) PCT No.: PCT/CN2013/085071
§ 371 (c)(1),
(2) Date: Apr. 11, 2016

(87) PCT Pub. No.: WO2015/051541
PCT Pub. Date: Apr. 16, 2015

(65) Prior Publication Data
US 2016/0229990 A1    Aug. 11, 2016

(51) Int. Cl.
| | | |
|---|---|---|
| B32B 3/10 | (2006.01) |
| C08K 5/5398 | (2006.01) |
| C08J 5/24 | (2006.01) |
| C08G 59/40 | (2006.01) |
| C08K 13/02 | (2006.01) |
| C08L 63/00 | (2006.01) |
| C08L 83/04 | (2006.01) |
| H05K 1/03 | (2006.01) |
| C08J 5/10 | (2006.01) |
| C08G 59/06 | (2006.01) |
| C08K 3/22 | (2006.01) |
| C08K 3/36 | (2006.01) |
| C08K 5/05 | (2006.01) |
| C08K 5/39 | (2006.01) |
| C08G 59/24 | (2006.01) |
| C08G 59/68 | (2006.01) |
| B32B 15/08 | (2006.01) |
| B32B 27/20 | (2006.01) |
| C08L 61/04 | (2006.01) |
| C08G 77/12 | (2006.01) |
| C08G 77/20 | (2006.01) |

(52) U.S. Cl.
CPC ............ *C08K 5/5398* (2013.01); *B32B 15/08* (2013.01); *B32B 27/20* (2013.01); *C08G 59/063* (2013.01); *C08G 59/245* (2013.01); *C08G 59/40* (2013.01); *C08G 59/4021* (2013.01); *C08G 59/686* (2013.01); *C08J 5/10* (2013.01); *C08J 5/24* (2013.01); *C08K 3/22* (2013.01); *C08K 3/36* (2013.01); *C08K 5/05* (2013.01); *C08K 5/39* (2013.01); *C08K 13/02* (2013.01); *C08L 61/04* (2013.01); *C08L 63/00* (2013.01); *C08L 83/04* (2013.01); *H05K 1/0366* (2013.01); *H05K 1/0373* (2013.01); *C08G 77/12* (2013.01); *C08G 77/20* (2013.01); *C08J 2300/24* (2013.01); *C08J 2363/00* (2013.01); *C08J 2483/04* (2013.01); *C08L 2203/20* (2013.01); *C08L 2666/48* (2013.01); *C08L 2666/72* (2013.01); *H05K 1/0346* (2013.01); *H05K 2201/0162* (2013.01); *H05K 2201/0206* (2013.01); *H05K 2201/0209* (2013.01); *H05K 2201/068* (2013.01); *H05K 2203/121* (2013.01)

(58) Field of Classification Search
None
See application file for complete search history.

(56) References Cited

U.S. PATENT DOCUMENTS

| | | | | |
|---|---|---|---|---|
| 2005/0159516 A1* | 7/2005 | Kwon | .................... | B32B 15/14 524/96 |
| 2009/0017316 A1* | 1/2009 | Kato | ....................... | C08L 79/04 428/447 |
| 2012/0077401 A1* | 3/2012 | Kotake | ................... | B32B 27/38 442/147 |

FOREIGN PATENT DOCUMENTS

| | | |
|---|---|---|
| CN | 101845200 A | 9/2010 |
| CN | 102656234 A | 9/2012 |
| CN | 103080225 A | 5/2013 |
| CN | 102660102 B | 6/2013 |
| CN | 103497488 A | 1/2014 |
| EP | 2762451 A1 | 8/2014 |
| JP | 2005350635 A | 12/2005 |
| JP | 2011157509 A * | 8/2011 |
| JP | 2013060607 A | 4/2013 |
| JP | 2013100382 A | 5/2013 |
| JP | 6051712 B2 | 12/2016 |
| JP | 6058426 B2 | 1/2017 |
| KR | 20090066714 A | 6/2009 |
| WO | 2004056913 A1 | 7/2004 |
| WO | 2013047203 A1 | 3/2013 |

OTHER PUBLICATIONS

Fire retardant additives retrieved on Apr. 2, 2018.*
ISA / CN, International Search Report and Written Opinion prepared for PCT/CN2013/085071, dated Jul. 11, 2014.
European Search Report and Written Opinion dated May 26, 2017, European Application No. 143 89 5432.6.

* cited by examiner

*Primary Examiner* — Christopher M Polley
(74) *Attorney, Agent, or Firm* — McDonald Hopkins LLC

(57) ABSTRACT

A thermosetting resin composition comprising a thermosetting resin, an inorganic filler, and an organomolybdenum compound is disclosed. The thermosetting resin composition may be used for preparing a resin vanish and a prepreg, wherein the prepreg is used for laminates and printed circuit boards.

17 Claims, No Drawings

THERMOSETTING RESIN COMPOSITION AND USES THEREOF

CROSS REFERENCE TO RELATED APPLICATIONS

This application is a 35 U.S.C. 371 national stage filing and claims priority to International Application No. PCT/CN2013/085071 filed on Oct. 11, 2013, entitled "THERMOSETTING RESIN COMPOSITION AND USES THEREOF," which is incorporated herein by reference in its entirety.

BRIEF SUMMARY OF THE INVENTION

The present invention relates to a thermosetting resin composition and uses thereof, and specifically relates to a thermosetting resin composition, as well as a resin varnish, a prepreg, a laminate, and a printed circuit board prepared from the thermosetting resin composition.

BACKGROUND OF THE INVENTION

With the development of electronic products in the direction of miniaturization, multi-functionalization, high performance, and high reliability, printed circuit boards are rapidly developed in the direction of high precision, high density, high performance, microporation, thinning tendency, and multiple stratification. The application scope thereof, which has become wider, is quickly going from industrial large-scale computers, communication instruments, electronic measurements, national defenses, aviation, and aerospace to civilian electronics and related products. The matrix material largely determines the performance of printed circuit boards, such that there is an urgent need to develop a new generation of matrix materials. The new generation of matrix material should have high heat resistance, low thermal expansion coefficients, and excellent chemical stability and mechanical performances.

In order to decrease the thermal expansion coefficient of laminates, the general method is to use the resins having a low thermal expansion coefficient or to increase the content of the inorganic filler. However, the resins having a low thermal expansion coefficient have a relatively special structure and a higher cost. To increase the content of the inorganic filler not only effectively decreases the thermal expansion coefficient of the complexes, but it also greatly reduces the cost. Highly-filled resins will obviously decrease drilling processability and interstratified adhesive force of the laminates. Massive fillers, such as talc etc., are added as a lubricant to improve processability, but it is ineffective. Moreover, the addition of massive fillers further deteriorates the adhesive force between the layers. In order to increase the drilling processability, metal molybdenum compounds are added. For example, CN102656234A discloses adding metal molybdenum compounds such as zinc molybdate to improve processability, and recommends using molybdenum compound particles supported on talc, etc., which results in notably reduced interstratified adhesive force of laminates. Furthermore, such molybdenum compounds have a worse dispersibility in resins, so they require a specific dispersion apparatus to disperse. Such molybdenum compounds also have a higher density and are easy to precipitate, so that satisfactory results cannot be reached.

DETAILED DESCRIPTION OF THE INVENTION

As to the problem in the prior art, the present invention provides a thermosetting resin composition. The thermosetting resin composition, even if highly-filled with inorganic fillers, can also inhibit the deteriorations of the drilling processability and the interstratified adhesive force. The laminates using the thermosetting resin composition have low thermal expansion coefficient, excellent drilling processability, heat resistance, and high interstratified adhesive force.

In order to achieve the aforesaid objective, the present invention uses the following technical solution:

a thermosetting resin composition comprising a thermosetting resin, an inorganic filler, and an organomolybdenum compound.

The addition of organomolybdenum compounds and inorganic fillers into the thermosetting resin of the present invention can not only improve the thermal expansion coefficient, enhancing the drilling processability of the laminates, but also greatly improve the compatibility between the thermosetting resin and inorganic fillers, as well as the interstratified adhesive force of the laminates and reduce the water absorption of the laminates. Since organomolybdenum compounds have a low density and are organic materials, they are compatible with organic systems. Thus no complex dispersion apparatus is needed to obtain homogeneously dispersed and stable resin compositions.

Preferably, the thermosetting resin composition further comprises organosilicone powder. Such organosilicone powder has excellent lubricity, elasticity, flame retardancy, and heat resistance, so as to make the thermosetting resin composition obtain better drilling processability and interstratified adhesive force, and better overall performance.

Preferably, the organomolybdenum compound is in an amount of from about 0.01 to about 20 wt. % of the total mass of the thermosetting resin composition. If such amount is lower than 0.01 wt. % of the total mass of the thermosetting resin composition, there will be no effect on obviously improving the drilling processability and interstratified adhesive force; if such amount is higher than 20 wt. % of the total mass of the thermosetting resin composition, the original overall performance of the thermosetting resin composition will be affected. Preferably, the organomolybdenum compound is in an amount of from about 0.5 to about 18.5 wt. %, further preferably from about 1 to about 17 wt. % of the total mass of the thermosetting resin composition.

The organomolybdenum compound is in an amount of about, e.g., 0.1 wt. %, 1.5 wt. %, 2 wt. %, 4 wt. %, 6 wt. %, 8 wt. %, 10 wt. %, 12 wt. %, 14 wt. %, 16 wt. %, 17.5 wt. %, 18 wt. %, or 19 wt. %, of the total mass of the thermosetting resin composition.

The organomolybdenum compound is selected from the group consisting of: oxymolybdenum dialkyldithiophosphate, molybdenum dialkyldithiocarbamate, molybdenum amine complex, molybdenum naphthenate, molybdenum alkylalicylate, ammonium octamolybdate, dithiolan molybdenum, dimercapto thiazole molybdenum, alkylamine molybdenum, organic molybdate and molybdenum caprylate, non-active organomolybdenum or organic active molybdenum or a mixture of at least two or more thereof. The mixture is selected from the group consisting of, e.g., a mixture of molybdenum dialkyldithiocarbamate and molybdenum amine complex, a mixture of molybdenum naphthenate and molybdenum alkylalicylate, a mixture of organic active molybdenum and oxymolybdenum dialkyldithiophosphate, a mixture of nitrogen-containing oxymolybdenum dialkyldithiophosphate and molybdenum dialkyldithiocarbamate, a mixture of molybdenum amine complex and molybdenum naphthenate, a mixture of molybdenum alkylalicylate and organic active molybdenum, a mixture of oxymolybdenum dialkyldithiophosphate, nitrogen-containing oxymolybdenum dialkyldithiophosphate and molybdenum dialkyldithiocarbamate, a mixture of molybdenum amine complex, molybdenum naphthenate, molybdenum alkylalicylate, and organic active molybdenum, a mixture of oxymolybdenum dialkyldithiophosphate, nitrogen-containing oxymolybdenum dialkyldithiophosphate, molybdenum dialkyldithiocarbamate, and molybdenum amine complex, and a mixture of molybdenum naphthenate, molybdenum alkylalicylate, and organic active molybdenum.

Preferably, the organomolybdenum compound is in powder form and has an average particle size of from about 0.1 to about 50 μm, preferably from about 0.5 to about 20 μm. Preferably, the organomolybdenum compound is selected from the group consisting of molybdenum dialkyldithiocarbamate and/or ammonium octamolybdate.

Preferably, the organomolybdenum compound is in a liquid form. The organomolybdenum compound in liquid form has a better dispersibility and better compatibility to resins, and the resultant resin complex has a better stability. Preferably, the organomolybdenum compound is selected from the group consisting of sulfurized oxymolybdenum dialkyldithiophosphate, organic molybdate, non-active organomolybdenum, and molybdenum caprylate, or a mixture of at least two or more thereof.

The organosilicone powder is in an amount of from about 0.1 to about 30 wt. % of the total mass of the thermosetting resin composition. If such amount is lower than about 0.1 wt. % of the total mass of the thermosetting resin composition, there will be no effect on obviously improving the drilling processability and interstratified adhesive force; if such amount is higher than about 30 wt. % of the total mass of the thermosetting resin composition, the original overall performance of the thermosetting resin composition will be affected. Preferably, the organosilicone powder is in an amount of from about 5 to about 20 wt. % of the total mass of the thermosetting resin composition. When the amount thereof is from about 5 to about 20 wt. % of the total mass of the thermosetting resin composition, the organosilicone powder has the best performance, and the resin composition has the best dispersibility and fluidity.

The organosilicone powder is in an amount of about, e.g., 0.5 wt. %, 1.5 wt. %, 3.5 wt. %, 5.5 wt. %, 7.5 wt. %, 9.5 wt. %, 12 wt. %, 14 wt. %, 16 wt. %, 18 wt. %, 20 wt. %, 22 wt. %, 24 wt. %, 26 wt. % or 28 wt. %, of the total mass of the thermosetting resin composition.

The organosilicone powder is selected from the group consisting of: fine powder of polymethylsilsesquioxane (in which the siloxane bond is crosslinked in a three-dimensional network manner), micropowder formed from the addition polymers of methylhydrogenpolysiloxane and dimethylpolysiloxane containing ethylene groups, powder obtained by coating with polymethylsilsesquioxane (in which the siloxane bond is crosslinked in a three-dimensional network manner), the surface of fine powder formed from the addition polymers of methylhydrogenpolysiloxane and dimethylpolysiloxane containing ethylene groups, or powder obtained by coating inorganic carrier surface with polymethylsilsesquioxane (in which the siloxane bond is crosslinked in a three-dimensional network manner), or a mixture of at least two or more thereof, and analogs thereof.

Preferably, the inorganic filler is selected from the group consisting of silica, boehmite, alumina, talc, mica, kaolin, aluminium hydroxide, magnesium hydroxide, zinc borate, zinc stannate, zinc oxide, titania, boron nitride, calcium carbonate, barium sulfate, barium titanate, aluminium borate, potassium titanate, E-glass powder, S-glass powder, D-glass powder, NE-glass powder, hollow micropowder or boehmite, or a mixture of at least two or more thereof.

The mixture is selected from the group consisting of, e.g., a mixture of silica and boehmite, a mixture of alumina and talc; a mixture of mica and kaolin; a mixture of aluminium hydroxide and magnesium hydroxide; a mixture of zinc borate and zinc stannate, a mixture of zinc oxide and titania; a mixture of boron nitride and calcium carbonate; a mixture of barium sulfate and barium titanate; a mixture of aluminium borate and potassium titanate; a mixture of E-glass powder and S-glass powder; a mixture of D-glass powder and NE-glass powder; a mixture of hollow micropowder and boehmite; a mixture of silica, boehmite and alumina; a mixture of talc, mica, and kaolin; a mixture of aluminium hydroxide, magnesium hydroxide, and zinc borate; a mixture of zinc stannate, zinc oxide, and titania; a mixture of boron nitride, calcium carbonate, and barium sulfate; a mixture of barium titanate, aluminium borate, and potassium titanate; a mixture of E-glass powder, S-glass powder, and D-glass powder; and a mixture of NE-glass powder, hollow micropowder, and boehmite.

Preferably, the inorganic filler is in an amount of from about 10 to about 80 wt. %, preferably from about 20 to about 60 wt. % of the total mass of the thermosetting resin composition. The amount of the inorganic filler is set to be from about 20 to about 60 wt. % of the total mass of the thermosetting resin composition, which can better maintain the formability and low thermal expansion of the thermosetting resin composition. While highly-filled with the inorganic filler, the thermosetting resin composition, employing the technical solution of the present invention, can also inhibit the deteriorations of the drilling processability and the interstratified adhesive force. The resultant laminates have low thermal expansion coefficient, excellent drilling processability and heat resistance, and high interstratified adhesive force.

The inorganic filler is in an amount of about, e.g., 23 wt. %, 28 wt. %, 32 wt. %, 37 wt. %, 42 wt. %, 47 wt. %, 52 wt. %, 57 wt. %, 62 wt. %, 67 wt. %, 72 wt. %, 76 wt. %, or 78 wt. % of the total mass of the thermosetting resin composition.

Preferably, the inorganic filler has an average particle size of from about 0.1 to about 100 μm, preferably from about 0.5 to about 20 When the average particle size of inorganic filler is set to be higher than about 0.1 the fluidity inside the highly-filled thermosetting resin composition will be better maintained; when it is below about 100 μm, the interfusion probability of oversize particles will be decreased, and the undesirable occurrence of oversize particles will be inhibited. The average particle size herein refers to the particle size of particles which have about 50% of the volume when the accumulation dimensionality distribution curve based on particle size is determined while the total volume of particles is deemed as 100%. It can be measured by particle size distribution of the laser diffraction scattering method.

Preferably, the thermosetting resin is in an amount of about 20 to about 70 wt. %, preferably about 25 to about 65 wt. %, further preferably about 30 to about 60 wt. % of the total mass of the thermosetting resin composition. The thermosetting resin is in an amount of about, e.g., 23 wt. %, 26 wt. %, 31 wt. %, 35 wt. %, 39 wt. %, 43 wt. %, 47 wt. %, 51 wt. %, 55 wt. %, 59 wt. %, 63 wt. %, or 67 wt. % of the total mass of the thermosetting resin composition.

Preferably, the thermosetting resin composition further comprises a curing agent in an amount of about 1 to about 30 wt. %, preferably about 4 to about 25 wt. %, further preferably about 10 to about 20 wt. % of the total mass of the thermosetting resin composition. The thermosetting resin composition further comprises a curing agent in an amount of about, e.g., 2 wt. %, 5 wt. %, 8 wt. %, 11 wt. %, 14 wt. %, 17 wt. %, 19 wt. %, 22 wt. %, 26 wt. %, or 28 wt. % of the total mass of the thermosetting resin composition.

Preferably, the thermosetting resin composition further comprises an accelerant in an amount of about 0 to about 10 wt. % of the total mass of the thermosetting resin composition, excluding 0, preferably from about 1 to about 10 wt. %, further preferably from about 2 to about 8 wt. %. The accelerant is in an amount of about, e.g., 0.5 wt. %, 1.5 wt. %, 2.5 wt. %, 3.5 wt. %, 4.5 wt. %, 5.5 wt. %, 6.5 wt. %, 7.5 wt. %, 8.5 wt. %, or 9.5 wt. % of the total mass of the thermosetting resin composition.

Preferably, the thermosetting resin composition further comprises a silane coupling agent and/or a wetting dispersant. There are no specific definitions to said silane coupling agent as long as they are silane coupling agents used in the treatment of inorganic filler surface, e.g., one selected from the group consisting of: aminosilanes such as γ-aminopropyltriethoxysilane and N-β-(aminoethyl)-γ-aminopropyltrimethoxysilane; epoxysilanes such as γ-glycidoxy propyl trimethoxy silane; ethylenesilanes such as γ-methacryloxy propyl trimethoxy silane; anionsilanes such as N-β-(N-vinylbenzilaminoethyl)-γ-aminopropyltrimethoxysilane hydrochloride; phenylsilanes; or a combination of two or more thereof. There is no special definition of the wetting dispersant is the dispersion stabilizer used in the coatings. The Examples utilize wetting dispersants from BYK Chemie Japan, e.g., Disperbyk-110, 111, 180, 161, BYK-W996, W9010, W903, and the like.

The wording "comprise(s)/comprising" in the present invention means that, besides said components, there may be other components which provide the resin composition with different properties. In addition, the wording "comprise(s)/comprising" in the present invention may be replaced with "is/are" or "consist(s) of" in a closed manner. No matter which components the thermosetting resin composition comprises, the sum of the mass percent of each component in the thermosetting composition relative to the thermosetting resin component is 100%.

For example, said thermosetting resin composition may comprise various additives, specifically a flame retardant, antioxidant, heat stabilizer, antistatic agent, ultraviolet light absorber, pigment, colorant, or lubricant. These various additives may be used separately or in combination.

The resin composition of the present invention can be prepared via a well-known process by matching up, stirring, and mixing said thermosetting resin, inorganic filler, organomolybdenum compound, organosilicone powder, curing agent, and accelerant, as well as various additives.

The second objective of the present invention lies in providing a resin varnish obtained by dissolving or dispersing the aforesaid thermosetting resin composition in a solvent.

The solvent of the present invention is not specifically limited. As specific examples, the solvent may be selected from the group consisting of: alcohols such as methanol, ethanol, and butanol; ethers such as ethyl cellosolve, butyl cellosolve, glycol-methylether, carbitol, and butyl carbitol; ketones such as acetone, butanone, methylethylketone, methylisobutylketone, and cyclohexanone; aromatic hydrocarbons such as toluene, xylol, and mesitylene; esters such as ethoxyethyl acetate and ethyl acetate; and nitrogen-containing solvents such as N,N-dimethylformamide, N,N-dimethylacetamide, and N-methyl-2-pyrrolidone. The aforesaid solvents may be used separately or in combinations of two or more thereof. Preferably, aromatic hydrocarbons such as toluene, xylol, and mesitylene may be mixed with acetone, butanone, methylethylketone, methylisobutylketone, and cyclohexanone. Those skilled in the art can choose the amount of the solvents on the basis of their experiences as long as the resultant resin varnish reaches the desired viscosity to be used.

While the aforesaid resin composition is dissolved or dispersed in the solvent, an emulsifier may be added. The dispersion via an emulsifier can make the filler homogeneously disperse in varnish.

The third objective of the present invention is to provide a prepreg comprising a reinforcing material and the aforesaid thermosetting resin composition attached thereon after impregnation and drying.

The fourth objective of the present invention is to provide a laminate comprising at least one sheet of the above-described prepreg.

As compared to the prior art, the present invention has the following beneficial effects.

The addition of organomolybdenum compounds and inorganic fillers into the thermosetting resin of the present invention can not only improve the thermal expansion coefficient of laminates and improve the drilling processability of laminates, but may also greatly improve the compatibility between the thermosetting resin and inorganic filler and the interstratified adhesive force of laminates, and reduce the water absorption of laminates. The resulting thermosetting resin composition can inhibit the deterioration of the drilling processability and the interstratified adhesive force even if highly-filled with inorganic filler. The laminates obtained by using the thermosetting resin composition have low thermal expansion coefficient, excellent drilling processability and heat resistance, and high interstratified adhesive force. In addition, organosilicone powder is also used. Such organosilicone powder has excellent lubricity, elasticity, flame retardancy, and heat resistance, so as to make the resin composition have better drilling processability and overall performance.

EXAMPLES

The technical solution of the present invention is further illustrated by the following examples.

Examples 1-6

Brominated bisphenol A type epoxy resin (Dow Chemical, epoxide equivalent being 435, bromine content being 19%, product name being DER530), dicyandiamide, 2-methylimidazole, organomolybdenum compound, organosilicone powder and inorganic filler were dissolved in an organic solvent, mechanically stirred, and emulsified to formulate 65 wt. % of a varnish. Then a glass fiber cloth was impregnated with the material, heated, and dried to form a prepreg. Copper foils were put to both sides thereof, pressed, and heated to produce a copper-clad laminate.

The resulting copper-clad laminate and the following process were used to evaluate the drilling processability, thermal expansion coefficient, interstratified adhesive force and dispersibility effects. The results are shown in Table 1.

A) Organomolybdenum compounds

A-1 Molybdenum dialkyldithiocarbamate, D50=10 μm, Pacific Ocean United (Beijing) Petrochemical Co., Ltd.;

A-2 Sulfurized oxymolybdenum dialkyldithiophosphate, self-made;

A-3 Organic molybdate, self-made;

B) Inorganic fillers

B-1 Molten spherical silica powder, Denka, SFP30M, having an average particle size of 0.5 μm;

B-2 Molten irregular silica, Sibelco, 525, having an average particle size of 2 μm;

B-3 Complex silica powder, Sibelco, G2C, having an average particle size of 2 μm;

B-4 Boehmite, Nabaltec, AOH30;

B-5 Boehmite, Nabaltec, AOH60;

C) Organosilicone powder

C-1 Silicone rubber powder, KMP-594, Shin-Etsu Chemical, having an average particle size of 5 μm;

C-2 Silicone rubber powder with the surface covered by silicone resin, KMP-605, Shin-Etsu Chemical, having an average particle size of 2 μm;

C-3 Silicone rubber powder, Tospearl 120, Momentive Performance Materials;

Example 7

Except for not complexing with organosilicone powder, the same process of Example 1 was used to obtain a copper-clad laminate using the resin composition. The assay and evaluation results are shown in Table 1.

Comparison Example 1

Except for replacing organomolybdenum compound and organosilicone powder with zinc molybdate (zinc molybdate, Kemgard, 911B), the same process as in Example 1 was used to obtain a copper-clad laminate using the resin composition. The assay and evaluation results are shown in Table 2.

Comparison Example 2

Except for replacing organomolybdenum compound and organosilicone powder with calcium molybdate (calcium molybdate, Kemgard, 911A), the same process as in Example 3 was used to obtain a copper-clad laminate using the resin composition. The assay and evaluation results are shown in Table 2.

Comparison Example 3

Except for not complexing with organomolybdenum compound, the same process as in Example 1 was used to obtain a copper-clad laminate using the resin composition. The assay and evaluation results are shown in Table 2.

Comparison Example 4

Except for not complexing with organosilicone powder and organomolybdenum compound, the same process as in Example 1 was used to obtain a copper-clad laminate using the resin composition. The assay and evaluation results are shown in Table 2.

1. Evaluation of Drilling Processability

Two drill spindles having close effects from 6-axis drilling machine were chosen to drill. Each board was drilled for 6 new drilling tools, and each drilling tool was used to drill 6000 holes. Then an inspection microscope was used to observe the cutting edge of the drilling tool, to determine the retract amount after abrasion of the blade tip, and to determine the distance between the intersection point of perpendicular line and axle wire and the upper edge of the abrasion as the size of the drilling tool. The following formula was used to calculate the wear rate of the drilling tool and to evaluate the drilling processability.

Wear rate %=distance between the edge and the axle wire after drilling/distance between the edge and the axle wire before drilling×100%

2. Assay of Thermal Expansion Coefficient

An etching solution was used to remove copper foils from copper-clad laminates, so as to cut into test pieces having a volume of 5 mm×5 mm. TMA test apparatus was used to determine the average linear thermal expansion rate in the direction of the Z-axis (the direction to which the glass fabric is perpendicular) at about 30 to about 260° C. and a temperature increasing rate of about 10° C./min. The lower the thermal expansion rate was, the better the effect was.

3. Interstratified Adhesive Force

An etching solution was used to remove copper foils from copper-clad laminates, so as to cut into test pieces having a volume of 100 mm×3 mm. A peeling-resistance test device was used to peel off and stratify the laminates at 50.8 mm/min to test the interstratified peel strength of the laminates. The greater the value was, the better the interstratified adhesive force of resins was.

4. Evaluation of Bonding Interface Between the Filler and Resin

Laminates were peeled off and cut into a size of 5 mm square, placed on the conducting resin and metal-sprayed to produce viewing test piece. A scanning electron microscope was used to observe the interface between the filler and resin and to evaluate.

5. Evaluation of Dispersion Uniformity of Fillers in the Resin

Laminates were cut into a size of 5 mm square, molded with the resin, placed on the conducting resin and metal-sprayed to produce viewing test piece. A scanning electron microscope was used to observe the dispersion of the resin in the filler and to evaluate.

6. Evaluation of Stability of Resin Compositions 100 ml of the resin composition was placed in a stoppered graduated measuring glass and stood at room temperature of 25° C. to determine the time for the precipitate to detain to the bottom of the settling tube and to evaluate the stability.

Example 1 was used to obtain a copper-clad laminate using the resin composition. The assay and evaluation results are shown in Table 2.

TABLE 1

| Ingredients/mass parts | Example 1 | Example 2 | Example 3 | Example 4 | Example 5 | Example 6 | Example 7 |
|---|---|---|---|---|---|---|---|
| DER530 | 100 | 100 | 100 | 100 | 100 | 100 | 100 |
| Dicyandiamide | 3 | 3 | 3 | 3 | 3 | 3 | 3 |
| 2-methyl-imidazole | 0.05 | 0.05 | 0.05 | 0.05 | 0.05 | 0.05 | 0.05 |

TABLE 1-continued

| Ingredients/mass parts | Example 1 | Example 2 | Example 3 | Example 4 | Example 5 | Example 6 | Example 7 |
|---|---|---|---|---|---|---|---|
| A) Organomolybdenum compound | | | | | | | |
| A-1 | 5 | | | | | | 5 |
| A-2 | | 5 | | 5 | | 5 | |
| A-3 | | | 5 | | 5 | | |
| B) Inorganic filler | | | | | | | |
| B-1 Molten spherical silica powder | 80 | 80 | | | | | 80 |
| B-2 Molten irregular silica | | | 80 | | | | |
| B-3 Complex silica powder | | | | 80 | 80 | 50 | |
| Boehmite B-4 | | | | | | 30 | |
| Organosilicone powder C-1 | 5 | | | | 3 | 3 | |
| Organosilicone powder C-2 | | 3 | 5 | 5 | | | |
| Assay/evaluation | | | | | | | |
| Wear rate of drilling tool/% | 59 | 62 | 62 | 50 | 55 | 53 | 67 |
| Thermal expansion coefficient/% | 2.0 | 2.1 | 2.2 | 2.3 | 2.3 | 2.4 | 2.2 |
| Interstratified adhesive force/N · mm$^{-1}$ | 0.65-0.80 | 0.7-0.84 | 0.65-0.79 | 0.6-0.75 | 0.62-0.74 | 0.59-0.70 | 0.60-0.70 |
| Bonding interface | ○ | ○ | ○ | ○ | ○ | ○ | ○ |
| Dispersibility | ○ | ○ | ○ | ○ | ○ | ○ | ○ |
| Stability/day | 11 | 14 | 14 | 13 | 11 | 11 | 12 |

TABLE 2

| Ingredients/mass parts | Comp. Example 1 | Comp. Example 2 | Comp. Example 3 | Comp. Example 4 |
|---|---|---|---|---|
| DER530 | 100 | 100 | 100 | 100 |
| Dicyandiamide | 3 | 3 | 3 | 3 |
| 2-methylimidazole | 0.05 | 0.05 | 0.05 | 0.05 |
| A) Organomolybdenum compound | | | | |
| A-3 | | | | |
| B) Inorganic filler | | | | |
| B-1 Molten spherical silica powder | 80 | | 80 | 80 |
| B-2 Molten irregular silica | | 80 | | |
| Organosilicone powder C-2 | | | 5 | |
| Zinc molybdate | 5 | | | |
| Calcium molybdate | | 5 | | |
| Assay/evaluation | | | | |
| Wear rate of drilling tool/% | 75 | 79 | 85 | 96 |
| Thermal expansion coefficient/% | 2.2 | 2.2 | 2.0 | 2.2 |
| Interstratified adhesive force/N · mm$^{-1}$ | 0.3-0.56 | 0.26-0.45 | 0.41-0.59 | 0.36-0.6 |
| Bonding interface | x | x | Δ | x |
| Dispersibility | Δ | Δ | ○ | Δ |
| Stability/day | 3 | 3 | 9 | 3 |

Notes for Tables 1 and 2: "○" refers to excellence, "Δ" refers to better, "x" refers to worse.

It can be seen in Tables 1 and 2 that, among Comparison Examples 1, 2, and 4 and in the DICY curing system, the peel strength, interstratified adhesive force, stability and dispersibility of the resin composition added with organomolybdenum compounds were notably superior to the resin composition added with zinc molybdate and calcium molybdate and not added with any molybdenum compounds. According to Examples 1-7, many organomolybdenum compounds had better compatibility with many inorganic fillers, and the drilling processability was greatly improved. In Comparison Example 3, the effect on improving the drilling processability was limited since organosilicone powder was used separately. In Example 1, organomolybdenum compound was used together with organosilicone powder, and the drilling processability was superior to those in which only organosilicone powder was used. Moreover, the improvement rate was as high as about 8 to about 24%, showing remarkable effects. Moreover, the overall performance thereof, such as thermal expansion coefficient and interstratified adhesive force, was also improved or increased to some extent. Thus compounding an organomolybdenum compound with an organosilicone powder had a synergistic effect. In Examples 4-6, since complex silica powder and boehmite both had a hardness less than spherical silicon and crystal silicon, they had better processability.

Examples 8-13

100 parts by weight of brominated bisphenol A type epoxy resin (Dow Chemical, epoxide equivalent being 435, bromine content being 19%, product name being DER530), 24 parts by weight of linear phenolic resin (Gun-Ei Chemical, hydroxyl equivalent being 105, product name being TD2090), 0.05 part by weight of 2-methylimidazole, organomolybdenum compound, organosilicone powder, and inorganic filler were dissolved in an organic solvent, mechanically stirred, and emulsified to formulate 65 wt. % of a varnish. Then a glass fiber cloth was impregnated therein, heated, and dried to form a prepreg. Copper foils were put to both sides thereof, pressed, and heated to produce a copper-clad laminate.

The resulting copper-clad laminate and the following process were used to evaluate the drilling processability, thermal expansion coefficient, interstratified adhesive force and dispersibility effects, and the results are shown in Table 3.

Example 14

Except for not complexing with organosilicone powder, the same process as in Example 8 was used to obtain a copper-clad laminate using the resin composition. The assay and evaluation results are shown in Table 3.

Comparison Example 5

Except for replacing organomolybdenum compound with zinc molybdate (zinc molybdate, Kemgard, 911B), the same process as in Example 8 was used to obtain a copper-clad laminate using the resin composition. The assay and evaluation results are shown in Table 4.

Comparison Example 6

Except for replacing organomolybdenum compound with calcium molybdate (calcium molybdate, Kemgard, 911A), the same process as in Example 10 was used to obtain a copper-clad laminate using the resin composition. The assay and evaluation results are shown in Table 4.

Comparison Example 7

Except for not complexing with organomolybdenum compound, the same process as in Example 8 was used to obtain a copper-clad laminate using the resin composition. The assay and evaluation results are shown in Table 4.

Comparison Example 8

Except for not complexing with organosilicone powder and organomolybdenum compound, the same process as in Example 8 was used to obtain a copper-clad laminate using the resin composition. The assay and evaluation results are shown in Table 4.

TABLE 3

| Ingredients/ mass parts | Example 8 | Example 9 | Example 10 | Example 11 | Example 12 | Example 13 | Example 14 |
|---|---|---|---|---|---|---|---|
| DER530 | 100 | 100 | 100 | 100 | 100 | 100 | 100 |
| Phenolic resin | 24 | 24 | 24 | 24 | 24 | 24 | 24 |
| 2-methyl-imidazole | 0.05 | 0.05 | 0.05 | 0.05 | 0.05 | 0.05 | 0.05 |
| A) Organomolybdenum compound | | | | | | | |
| A-1 | | | 5 | | | | 5 |
| A-2 | 5 | | | 5 | | 5 | |
| A-3 | | 5 | | | 5 | | |
| B) Inorganic filler | | | | | | | |
| B-1 Molten spherical silica powder | 60 | 60 | | | | | |
| B-2 Molten irregular silica | | | 60 | | | | |
| B-3 Complex silica powder | | | | 60 | 60 | 40 | |
| Boehmite B-4 | | | | | | 20 | |
| Organosilicone powder C-1 | 5 | 3 | 3 | | | | |
| Organosilicone powder C-3 | | | | 3 | 3 | 1 | |
| Assay/evaluation | | | | | | | |
| Wear rate of drilling tool/% | 55 | 60 | 62 | 51 | 48 | 55 | 64 |
| Thermal expansion coefficient/% | 2.1 | 2.2 | 2.4 | 2.4 | 2.4 | 2.5 | 2.3 |
| Interstratified adhesive force/N · mm$^{-1}$ | 0.80-0.92 | 0.75-0.85 | 0.70-0.86 | 0.66-0.79 | 0.68-0.80. | 0.64-0.76 | 0.63-0.75 |
| Bonding interface | ○ | ○ | ○ | ○ | ○ | ○ | ○ |
| Dispersibility | ○ | ○ | ○ | ○ | ○ | ○ | ○ |
| Stability/day | 16 | 16 | 15 | 12 | 13 | 12 | 11 |

TABLE 4

| Ingredients/ mass parts | Comp. Example 5 | Comp. Example 6 | Comp. Example 7 | Comp. Example 8 |
|---|---|---|---|---|
| DER530 | 100 | 100 | 100 | 100 |
| Dicyandiamide | 24 | 24 | 24 | 24 |
| 2-methylimidazole | 0.05 | 0.05 | 0.05 | 0.05 |

TABLE 4-continued

| Ingredients/mass parts | Comp. Example 5 | Comp. Example 6 | Comp. Example 7 | Comp. Example 8 |
|---|---|---|---|---|
| A) Organomolybdenum compound | | | | |
| A-2 | | | | |
| B) Inorganic filler | | | | |
| B-1 Molten spherical silica powder | 60 | | 60 | 60 |
| B-2 Molten irregular silica | | 60 | | |
| Organosilicone powder C-3 | | | 5 | |
| Zinc molybdate | 5 | | | |
| Calcium molybdate | | 5 | | |
| Assay/evaluation | | | | |
| Wear rate of drilling tool/% | 70 | 76 | 81 | 95 |
| Thermal expansion coefficient/% | 2.3 | 2.4 | 2.1 | 2.5 |
| Interstratified adhesive force/N · mm$^{-1}$ | 0.4-0.61 | 0.32-0.56 | 0.35-0.56 | 0.36-0.65 |
| Bonding interface | x | x | Δ | x |
| Dispersibility | Δ | Δ | Δ | Δ |
| Stability/day | 5 | 5 | 9 | 5 |

Notes for Tables 3 and 4: "o" refers to excellence, "Δ" refers to better, and "x" refers to worse.

It can be seen according to Tables 3 and 4 that, among Comparison Examples 5, 6, and 8 and in the phenolic curing system, the peel strength, interstratified adhesive force, stability, and dispersibility of the resin composition added with organomolybdenum compounds were notably superior to the resin composition added with zinc molybdate and calcium molybdate and not added with any molybdenum compounds. According to Examples 8-13, many organomolybdenum compounds and many inorganic fillers had better compatibility, and the drilling processability thereof was greatly improved. Compared to Comparison Example 7, organomolybdenum compound was used together with organosilicone powder in Example 8, and the drilling processability thereof was prominently superior to those in which organosilicone powder was separately used. Moreover, the improvement rate was as high as about 9 to about 26%, which showed that the effect was remarkable. Moreover, the overall performance thereof, such as thermal expansion coefficient and interstratified adhesive force, was also improved or increased to some extent. Thus compounding an organomolybdenum compound with an organosilicone powder had a synergistic effect according to the test result data in Tables 3 and 4. In Examples 11-13, since complex silica powder and boehmite both had a hardness less than spherical silicon and crystal silicon, they had better processability.

Example 15

Brominated bisphenol A type epoxy resin (Dow Chemical, epoxide equivalent being 435, bromine content being 19%, product name being DER530), dicyandiamide, 2-methylimidazole, organomolybdenum compound, organosilicone powder, and inorganic filler were dissolved in an organic solvent, mechanically stirred, and emulsified to formulate 65 wt. % of a varnish. Then a glass fiber cloth was impregnated therein, heated, and dried to form a prepreg. Copper foils are put to both sides thereof, pressed and heated to produce a copper-clad laminate.

The organomolybdenum compound was ammonium octamolybdate having an average particle size of 0.1 μm.

The organosilicone powder was micropowder formed from the addition polymers of methylhydrogenpolysiloxane and dimethylpolysiloxane containing ethylene groups, The resultant copper-clad laminate and the following process were used to evaluate the drilling processability, thermal expansion coefficient, interstratified adhesive force and dispersibility effects, and the results are shown in Table 5.

Example 16

Except that ammonium octamolybdate had an average particle size of 0.5 μm, the same process as in Example 15 was used to obtain a copper-clad laminate using the resin composition. The assay and evaluation results are shown in Table 5.

Example 17

Except that ammonium octamolybdate had an average particle size of 20 μm and was added in an amount of 45 parts by weight, the same process as in Example 15 was used to obtain a copper-clad laminate using the resin composition. The assay and evaluation results are shown in Table 5.

Example 18

Except for the amount of organosilicone powder added therein, the same process as in Example 15 was used to obtain a copper-clad laminate using the resin composition. The assay and evaluation results are shown in Table 5.

Example 19

Except for the amounts of organosilicone powder and organomolybdenum compound added therein, the same process as in Example 15 was used to obtain a copper-clad laminate using the resin composition. The assay and evaluation results are shown in Table 5.

Example 20

Except for the amounts of organosilicone powder and organomolybdenum compound added therein, the same process as in Example 15 was used to obtain a copper-clad laminate using the resin composition. The assay and evaluation results are shown in Table 5.

TABLE 5

| Ingredients/mass parts | Example 15 | Example 16 | Example 17 | Example 18 | Example 19 | Example 20 |
|---|---|---|---|---|---|---|
| DER530 | 100 | 100 | 100 | 100 | 100 | 100 |
| Dicyandiamide | 3 | 3 | 3 | 3 | 3 | 3 |

TABLE 5-continued

| Ingredients/mass parts | Example 15 | Example 16 | Example 17 | Example 18 | Example 19 | Example 20 |
|---|---|---|---|---|---|---|
| 2-methylimidazole | 0.05 | 0.05 | 0.05 | 0.05 | 0.05 | 0.05 |
| Organomolybdenum compound | 0.05 | 0.05 | 45 | 0.05 | 5 | 5 |
| D glass powder | 80 | 80 | 45 | 80 | 80 | 80 |
| Organic silicon powder | 5 | 5 | 5 | 1 | 80 | 45 |
| Assay/evaluation | | | | | | |
| Wear rate of drilling tool/% | 75 | 72 | 45 | 80 | 61 | 65 |
| Thermal expansion coefficient/% | 2.2 | 2.2 | 2.4 | 2.2 | 1.9 | 2.0 |
| Interstratified adhesive force/N · mm$^{-1}$ | 0.58-0.65 | 0.6-0.68 | 0.65-0.81 | 0.53-0.62 | 0.60-0.75 | 0.61-0.74 |
| Bonding interface | ○ | ○ | ○ | ○ | ○ | ○ |
| Dispersibility | ○ | ○ | ○ | ○ | ○ | Δ |
| Stability/day | 9 | 11 | 15 | 10 | 9 | 8 |

It can be seen according to Tables 1-5 that, in the DICY curing system or phenolic curing system, the resin composition added with organomolybdenum compound and organosilicone powder could not only notably improve the drilling processability of the laminates, but also prominently improve the bonding interfaces between the inorganic filler and resin and between the resin and copper foil. Moreover, the dispersibility and stability of the resin composition were greatly improved.

The applicant declares that, the present invention discloses the process of the present invention in detail by the aforesaid examples. The present invention, however, is not limited by the detailed process, i.e., it does not mean that the present invention cannot be fulfilled unless the aforesaid detailed process is used. Those skilled in the art shall know that, any amendment, equivalent change to the product materials of the present invention, addition of auxiliary ingredients, and selection of any specific modes all fall within the protection scope and disclosure scope of the present invention.

The invention claimed is:

1. A thermosetting resin composition wherein the thermosetting resin composition comprises a thermosetting resin, an inorganic filler, and an organomolybdenum compound;
   wherein thermosetting resin composition further comprises organosilicone powder;
   wherein the organosilicone powder comprises about 0.1 to about 30 wt. %, of the total mass of the thermosetting resin composition; and
   wherein the organomolybdenum compound comprises about 0.01 to about 20 wt. % of the total mass of the thermosetting resin composition.

2. The thermosetting resin composition as claimed in claim wherein the organomolybdenum compound is selected from the group consisting of oxymolybdenum dialkyldithiophosphate, molybdenum dialkyldithiocarbamate, molybdenum amine complex, molybdenum naphthenate, molybdenum alkylalicylate, dithiolan molybdenum, dimercapto thiazole molybdenum, alkylamine molybdenum, organic molybdate and molybdenum caprylate, or a combination of at least two or more thereof.

3. The thermosetting resin composition of claim 1, wherein the organomolybdenum compound is in powder form and has an average particle size of from 0.1 to 50 μm.

4. The thermosetting resin composition of claim 1, wherein the organomolybdenum compound is in liquid form.

5. A resin varnish wherein the resin varnish is obtained by dissolving or dispersing the thermosetting resin composition of claim 1 in a solvent.

6. A prepreg comprising a reinforcing material and the thermosetting resin composition of claim 1 attached on the reinforcing material after impregnation and drying.

7. A laminate-comprising at least one prepreg of claim 6.

8. A printed circuit board wherein the printed circuit board comprises at least one sheet of the prepreg of claim 6.

9. The thermosetting resin composition of claim 3, wherein the organomolybdenum compound is selected from the group consisting of molybdenum dialkyldithiocarbamate, or a combination of two or more thereof.

10. The thermosetting resin composition as claimed in claim 4, wherein the organomolybdenum compound is selected from the group consisting of sulfurized oxymolybdenum dialkyldithiophosphate, organic molybdate, non-active organomolybdenum and molybdenum caprylate, or a combination of two or more thereof.

11. The thermosetting resin composition as claimed in claim 1, wherein the organosilicone powder is selected from the group consisting of fine powder of polymethylsilsesquioxane, micropowder formed from the addition polymers of methylhydrogenpolysiloxane and dimethylpolysiloxane containing ethylene groups, powder obtained by coating with polymethylsilsesquioxane the surface of fine powder formed from the addition polymers of methylhydrogenpolysiloxane and dimethylpolysiloxane containing ethylene groups, and powder obtained by coating inorganic carrier surface with polymethylsilsesquioxane, or a combination of two or more thereof.

12. The thermosetting resin composition as claimed in claim 1, wherein the inorganic filler is selected from the group consisting of silica, alumina, talc, mica, kaolin, aluminum hydroxide, magnesium hydroxide, zinc borate, zinc stannate, zinc oxide, titania, boron nitride, calcium carbonate, barium sulfate, barium titanate, aluminum borate, potassium titanate, E-glass powder, S-glass powder, D-glass powder, NE-glass powder, hollow micropowder or boehmite, or a combination of two or more thereof.

13. The thermosetting resin composition as claimed in claim 1, wherein the inorganic filler is in an amount of from about 10 to about 80 wt. % of the total mass of the thermosetting resin composition.

14. The thermosetting resin composition as claimed in claim 1, wherein the inorganic filler has an average particle size of from about 0.1 to about 100 μm.

15. The thermosetting resin composition as claimed in claim 1, wherein the thermosetting resin is in an amount of from about 20 to about 70 wt. % of the total mass of the thermosetting resin composition.

16. The thermosetting resin composition as claimed in claim 1, wherein the thermosetting resin composition further comprises a curing agent in an amount of from about 1 to about 30 wt. % of the total mass of the thermosetting resin composition.

17. The thermosetting resin composition as claimed in claim 1, wherein the thermosetting resin composition further comprises an accelerant in an amount of from about 1 to about 10 wt. %, excluding 0 wt. % of the total mass of the thermosetting resin composition.

\* \* \* \* \*